(12) United States Patent
Wang

(10) Patent No.: US 12,193,182 B2
(45) Date of Patent: Jan. 7, 2025

(54) HOT-SWAPPABLE ELECTRONIC DEVICE AND METHOD FOR PREVENTING CRASH OF THE SAME

(71) Applicant: Getac Technology Corporation, New Taipei (TW)

(72) Inventor: Chun-Chi Wang, Taipei (TW)

(73) Assignee: Getac Technology Corporation, New Taipei (TW)

(*) Notice: Subject to any disclaimer, the term of this patent is extended or adjusted under 35 U.S.C. 154(b) by 174 days.

(21) Appl. No.: 18/180,822

(22) Filed: Mar. 8, 2023

(65) Prior Publication Data

US 2024/0196551 A1 Jun. 13, 2024

(30) Foreign Application Priority Data

Dec. 13, 2022 (CN) .......................... 202211595983.9

(51) Int. Cl.
*H02J 7/02* (2016.01)
*H05K 5/02* (2006.01)

(52) U.S. Cl.
CPC .............. *H05K 5/0247* (2013.01); *H02J 7/02* (2013.01)

(58) Field of Classification Search
None
See application file for complete search history.

(56) References Cited

U.S. PATENT DOCUMENTS

| 5,825,100 A | 10/1998 | Kim |
| 8,533,509 B2 | 9/2013 | Kamijima |
| 9,966,758 B2 * | 5/2018 | Nordin ..................... H02J 9/061 |
| 10,348,126 B2 | 7/2019 | Tsai et al. |

(Continued)

FOREIGN PATENT DOCUMENTS

| CN | 103701195 A | 4/2014 |
| CN | 106655458 A | 5/2017 |

(Continued)

OTHER PUBLICATIONS

Office Action issued on May 22, 2024 for AU application No. 2023201340.

(Continued)

*Primary Examiner* — Xanthia C Relford
(74) *Attorney, Agent, or Firm* — Li & Cai Intellectual Property Office

(57) ABSTRACT

A hot-swappable electronic device and a method for preventing crash of the same are provided. The method includes: detecting, by a controller, whether or not the hot-swappable electronic device is in a power-on state; detecting, by the controller, whether or not a power connection port is connected to an alternating current power source when the hot-swappable electronic device is in the power-on state; detecting, by a first sensor and a second sensor, whether or not a first battery leaves a first battery installation groove and a second battery leaves a second battery installation groove when the power connection port is not connected to the alternating current power source; and lowering, by the controller, a system power consumption of the hot-swappable electronic device when the first battery leaves the first battery installation groove or the second battery leaves the second battery installation groove.

10 Claims, 4 Drawing Sheets

(56) References Cited

U.S. PATENT DOCUMENTS

| | | | |
|---|---|---|---|
| 10,423,561 B2 | 9/2019 | So et al. | |
| 10,630,102 B2 | 4/2020 | Sa | |
| 10,666,055 B2 * | 5/2020 | Garrity | H02J 50/10 |
| 2005/0052085 A1 * | 3/2005 | Chang | H02J 9/061 |
| | | | 307/66 |
| 2010/0264738 A1 | 10/2010 | Murtha et al. | |
| 2014/0082394 A1 | 3/2014 | Kitano et al. | |
| 2015/0189704 A1 * | 7/2015 | Williams | F21L 2/00 |
| | | | 315/86 |
| 2016/0274633 A1 * | 9/2016 | Nishimura | H02J 1/001 |
| 2018/0123385 A1 * | 5/2018 | Akiyama | H02J 7/007 |
| 2018/0188328 A1 * | 7/2018 | Hsieh | H02J 9/06 |
| 2018/0241236 A1 * | 8/2018 | Vasefi | H01M 10/425 |
| 2019/0187766 A1 | 6/2019 | Hirosawa et al. | |
| 2019/0237722 A1 * | 8/2019 | Gao | H01M 50/209 |
| 2022/0114056 A1 * | 4/2022 | Lee | G06F 1/30 |
| 2022/0216713 A1 | 7/2022 | Lo et al. | |

FOREIGN PATENT DOCUMENTS

| | | | |
|---|---|---|---|
| CN | 111934416 A | 11/2020 | |
| TW | 200640101 A | 11/2006 | |
| TW | M574778 U | 2/2019 | |
| TW | I760046 B | 4/2022 | |
| TW | 202227933 A | 7/2022 | |

OTHER PUBLICATIONS

Search Report issued on Sep. 21, 2023 for EP application No. 23160188.1.

* cited by examiner

HOT-SWAPPABLE ELECTRONIC DEVICE AND METHOD FOR PREVENTING CRASH OF THE SAME

CROSS-REFERENCE TO RELATED PATENT APPLICATION

This application claims the benefit of priority to China Patent Application No. 202211595983.9, filed on Dec. 13, 2022 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device and a protection method thereof, and more particularly to a hot-swappable electronic device and a method for preventing crash of the hot-swappable electronic device.

BACKGROUND OF THE DISCLOSURE

Currently in the marketplace, an electronic device having two batteries generally has a hot-swappable function. The hot-swappable function allows the electronic device to continue operation even when the electronic device is in a power-on state and one of the batteries is directly removed from the electronic device.

However, when the electronic device completely depends on power supplied by one single battery, if system load of the electronic device is too heavy, the electronic device may suddenly crash due to insufficient power of the single battery, thereby interrupting a user's operation of the electronic device.

SUMMARY OF THE DISCLOSURE

In response to the above-referenced technical inadequacies, the present disclosure provides a hot-swappable electronic device and a method for preventing crash of the same.

In order to solve the above-mentioned problems, one of the technical aspects adopted by the present disclosure is to provide a hot-swappable electronic device, which includes: a first battery installation groove; a first battery installed in the first battery installation groove; a second battery installation groove; a second battery installed in the second battery installation groove; a power connection port; a controller electrically connected to the power connection port; a first sensor electrically connected to the controller and assembled in the first battery installation groove; and a second sensor electrically connected to the controller and assembled in the second battery installation groove. The first sensor sends a first trigger signal to the controller when the first battery leaves the first battery installation groove. The second sensor sends a second trigger signal to the controller when the second battery leaves the second battery installation groove. The controller is used to determine whether or not the hot-swappable electronic device is in a power-on state and detect whether or not the power connection port is connected to an alternating current power source. When the hot-swappable electronic device is in the power-on state, the power connection port is not connected to alternating current power source and the controller receives the first trigger signal or the second trigger signal, the controller lowers a system power consumption of the hot-swappable electronic device.

In order to solve the above-mentioned problems, another one of the technical aspects adopted by the present disclosure is to provide a method for preventing crash of a hot-swappable electronic device. The method includes: determining, by a controller, whether or not the hot-swappable electronic device is in a power-on state; detecting, by the controller, whether or not a power connection port is connected to an alternating current power source when the hot-swappable electronic device is in the power-on state through the controller; detecting, by a first sensor, whether or not a first battery leaves a first battery installation groove when the power connection port is not connected to the alternating power source; detecting, by a second sensor, whether or not a second battery leaves a second battery installation groove when the power connection port is not connected to the alternating current power source; and lowering, by the controller, a system power consumption of the hot-swappable electronic device when the first battery leaves the first battery installation groove or the second battery leaves the second battery installation groove.

In order to solve the above-mentioned problems, yet another one of the technical aspects adopted by the present disclosure is to provide a method for preventing crash of a hot-swappable electronic device. The method includes: detecting, by a controller, whether or not a power connection port is connected to an alternating current power source; determining, by the controller, whether or not the hot-swappable electronic device is in a power-on state when the hot-swappable electronic device is not connected to an alternating current power source through the controller; detecting, by a first sensor, whether or not a first battery leaves a first battery installation groove when the hot-swappable electronic device is in the power-on state; detecting, by a second sensor, whether or not a second battery leaves a second battery installation groove when the hot-swappable electronic device is in the power-on state; and lowering, by the controller, a system power consumption of the hot-swappable electronic device when the first battery leaves from the first battery installation groove or the second battery leaves the second battery installation groove.

Therefore, in the hot-swappable electronic device and the method for preventing crash of the same provided by the present disclosure, when a user removes the first battery or the second battery from the hot-swappable electronic device, the hot-swappable electronic device is still able to operate in a stable manner and does not suddenly crash. Accordingly, the user's operation of the hot-swappable electronic device will not be interrupted by the crash.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
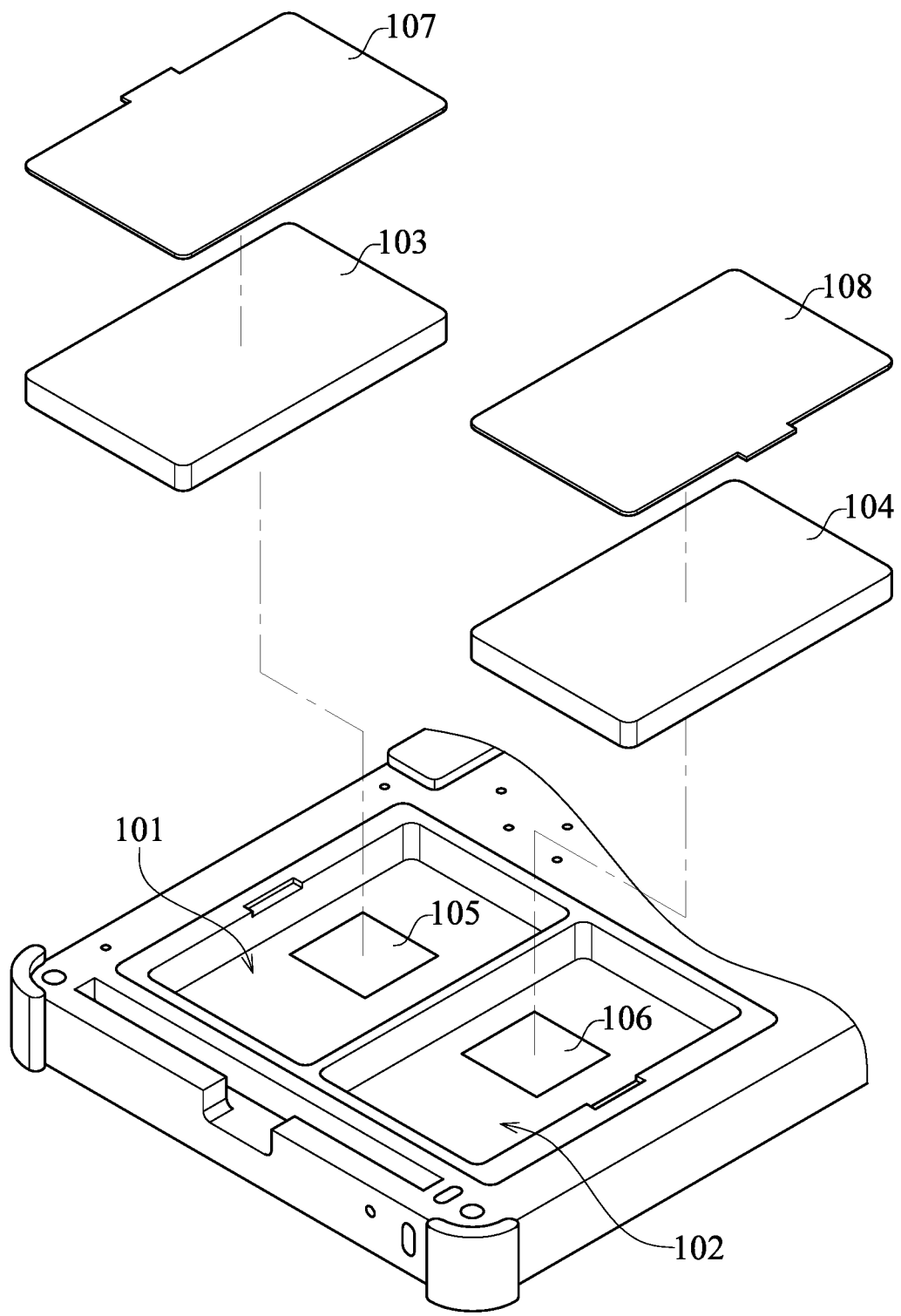
FIG. 1 is a schematic perspective view of a hot-swappable electronic device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

FIG. 1 is a schematic perspective view of a hot-swappable electronic device according to a first embodiment of the present disclosure. Referring to FIG. 1, the hot-swappable electronic device can be, for example, a laptop, but is not limited thereto. The hot-swappable electronic device includes a first battery installation groove 101, a second battery installation groove 102, a first battery 103, a second battery 104, a first sensor 105, a second sensor 106, a first battery cover 107, and a second battery cover 108. The first sensor 105 and the second sensor 106 can be, for example, two Hall sensors. However, the present disclosure is not limited thereto.

The first battery 103 is detachably installed in the first battery installation groove 101, and the first sensor 105 is disposed in the first battery installation groove 101. When the first battery 103 is installed in the first battery installation groove 101, the first battery 103 is in contact with the first sensor 105. The second battery 104 is detachably installed in the second battery installation groove 102, and the second sensor 106 is disposed in the second battery installation groove 102. When the second battery 104 is installed in the second battery installation groove 102, the second battery 104 is in contact with the second sensor 106. The first battery cover 107 is detachably assembled with the first battery installation groove 101 so as to cover the first battery 103, and the second battery cover 108 is detachably assembled with the second battery installation groove 102 so as to cover the second battery 104.

Figure 2:
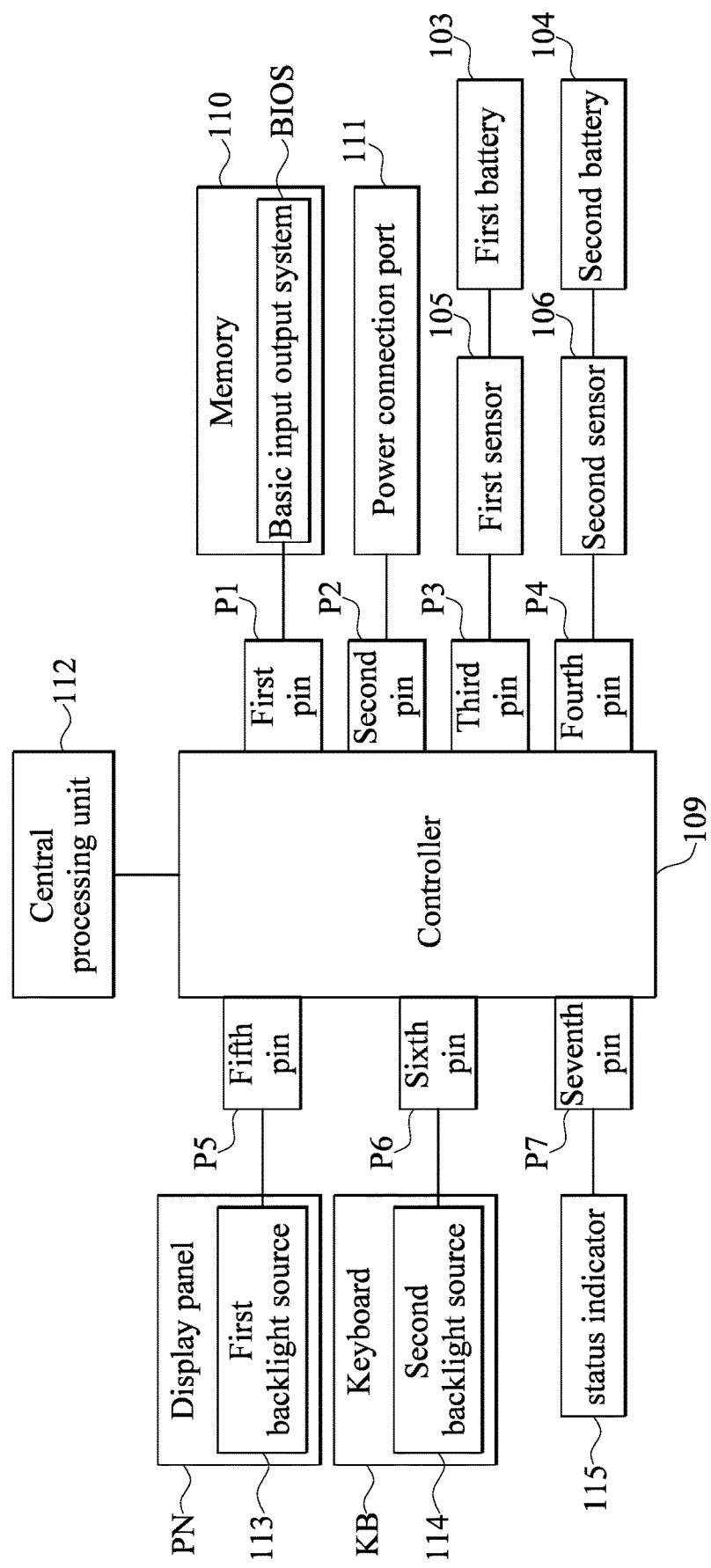
FIG. 2 is a functional block diagram of the hot-swappable electronic device according to the first embodiment of the present disclosure.

FIG. 2 is a functional block diagram of the hot-swappable electronic device according to the first embodiment of the present disclosure. Referring to FIG. 1 and FIG. 2, the hot-swappable electronic device further includes a controller 109, a memory 110, a power connection port 111, a central processing unit 112, a first backlight source 113, a second backlight source 114, and a state indicator 115. The controller 109 can be, for example, an embedded controller, but is not limited thereto. The controller 109 includes a first pin P1, a second pin P2, a third pin P3 and a fourth pin P4. A basic input output system BIOS is stored in the memory 110, and the first pin P1 of the controller 109 is electrically connected to the memory 110. The second pin P2 of the controller 109 is electrically connected to the power connection port 111. The third pin P3 of the controller 109 is electrically connected to the first sensor 105, and the fourth pin P4 of the controller 109 is electrically connected to the second sensor 106. When the first battery 103 leaves the first battery installation groove 101, the first sensor 105 is triggered and sends a first trigger signal to the controller 109. Similarly, when the second battery 104 leaves the second battery installation groove 102, the second sensor 106 is triggered and sends a second trigger signal to the controller 109.

The controller 109 further includes a fifth pin P5, a sixth pin P6, and a seventh pin P7. The controller 109 is electrically connected to the central processing unit 112 through a platform environment control interface (PECI) bus. The fifth pin P5 of the controller 109 is electrically connected to the first backlight source 113, and the first backlight source 113 can be, for example, disposed in a display panel PN of the hot-swappable electronic device. The sixth pin P6 of the controller 109 is electrically connected to the second backlight source 114, and the second backlight source 114 can be, for example, disposed in a keyboard KB of the hot-swappable electronic device. The seventh pin P7 of the controller 109 is electrically connected to the state indicator 115. Therefore, the controller 109 can control an operating frequency of the central processing unit 112, a brightness of the first backlight source 113, a brightness of the second backlight source 114, and a brightness of the state indicator 115.

The controller 109 determines whether or not the hot-swappable electronic device is in a power-on state according to parameters of the basic input output system BIOS. After the controller 109 confirms that the hot-swappable electronic device is in the power-on state, the controller 109 detects whether the power connection port 111 is connected to an alternating current (AC) power source. When the controller 109 confirms that the power connection port 111 is not connected to the AC power source, the controller 109 determines whether or not the first trigger signal from the first sensor 105 or the second trigger signal from the second sensor 106 is received. When the controller 109 confirms receipt of the first trigger signal from the first sensor 105 or the second trigger signal from the second sensor 106, the controller 109 lowers a system power consumption of the hot-swappable electronic device. With regard to lowering of the system power consumption, the controller 109 can, for example, lower at least one of the operating frequency of the central processing unit (CPU) 112, the brightness of the first backlight source 113, the brightness of the second backlight source 114, and the brightness of the state indicator 115.

As for other embodiments of the hot-swappable electronic device of the present disclosure, the first sensor 103 is disposed between the first battery installation groove 101 and the first battery cover 107, and the second sensor 104 is disposed between the second battery installation slot 102 and the second battery cover 108. When the first sensor 103 detects that the first battery cover 107 is detached from the first battery installation slot 101, the first sensor 103 sends the first trigger signal to the controller 109. Similarly, when the second sensor 104 detects that the second battery cover 108 is detached from the second battery installation slot 102, the second sensor 104 sends the second trigger signal to the controller 109.

Figure 3:
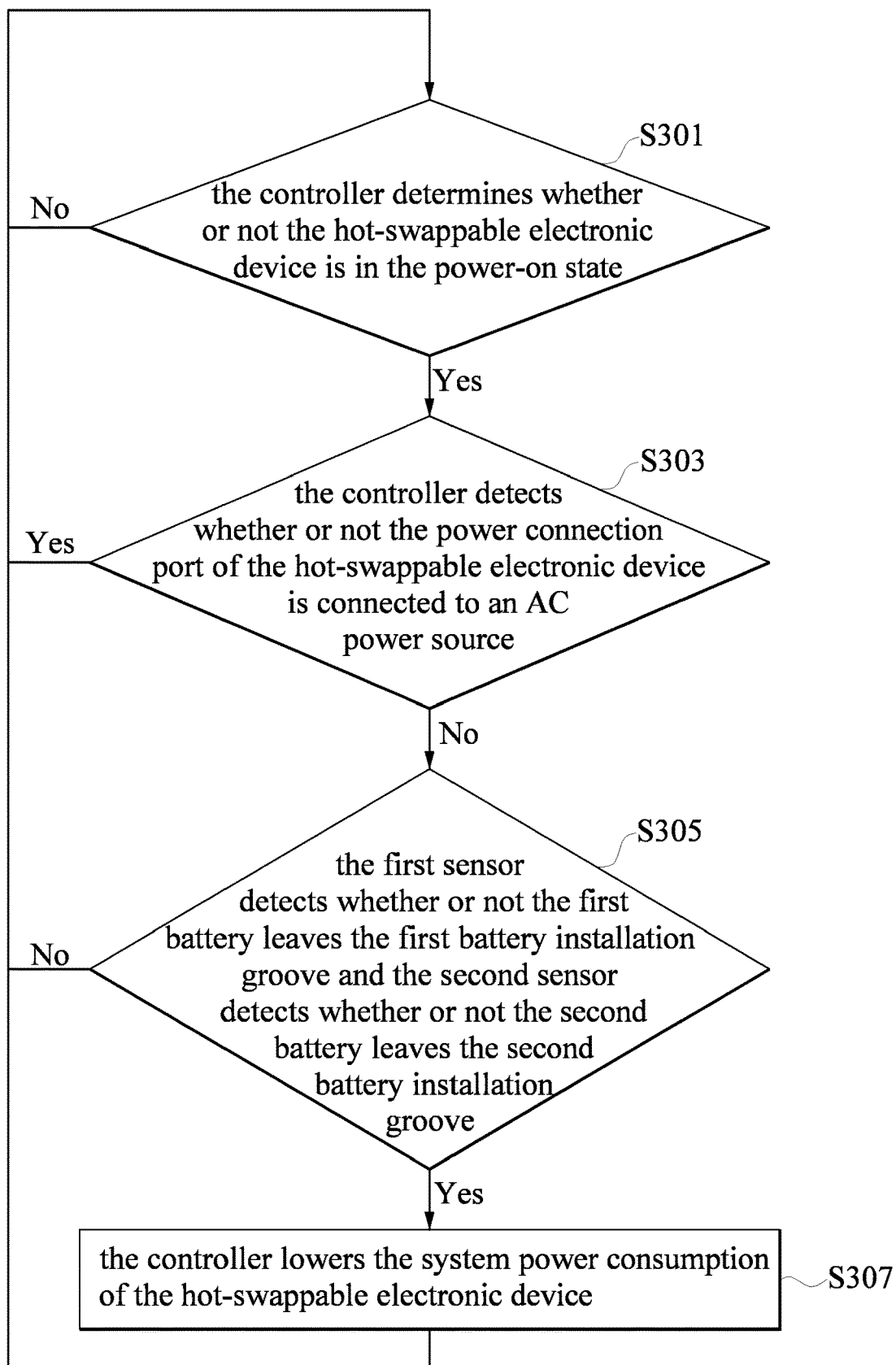
FIG. 3 is a flowchart of a method for preventing crash of the hot-swappable electronic device according to the first embodiment of the present disclosure.

FIG. 3 is a flowchart of a method for preventing crash of the hot-swappable electronic device according to the first embodiment of the present disclosure. In step S301, the controller 109 determines whether or not the hot-swappable electronic device is in the power-on state (as shown in FIG. 3). Specifically, the controller 109 determines whether or not the hot-swappable electronic device is in the power-on state by reading the parameters of the basic input output system BIOS in the memory 110.

When the controller 109 confirms that the hot-swappable electronic device is in the power-on state, step S301 is followed by step S303. When the controller 109 confirms that the hot-swappable electronic device is not in the power-on state, step S301 is executed again.

In step S303, the controller 109 detects whether or not the power connection port 111 of the hot-swappable electronic device is connected to an AC power source. When the controller 109 confirms that the power connection port 111 of the hot-swappable electronic device is not connected to an AC power source, step S303 is followed by step S305. When the controller 109 confirms that the power connection port 110 of the hot-swappable electronic device is connected to an AC power source, step S303 is followed by step S301.

In step S305, the first sensor 105 detects whether or not the first battery 103 leaves the first battery installation groove 101 and the second sensor 106 detects whether or not the second battery 104 leaves the second battery installation groove 102. When the first battery 103 leaves the first battery installation groove 101 or the second battery 104 leaves the second battery installation groove 102, step S305 is followed by step S307. When the first battery 103 does not leave the first battery installation groove 101 and the second battery 104 does not leave the second battery installation groove 102, step S305 is followed by step S301. Specifically, when the first battery 103 leaves the first battery installation groove 101, the first sensor 105 sends the first trigger signal to the controller 109. When the second battery 104 leaves the second battery installation groove 102, the second sensor 106 sends the second trigger signal to the controller 109. Therefore, when the controller 109 receives the first trigger signal or the second trigger signal, it means that one of the first battery 103 and the second battery 104 leaves the hot-swappable electronic device.

In step S307, the controller 109 lowers the system power consumption of the hot-swappable electronic device, step S307 is followed by step S301. With regard to lowering of the system power consumption, the controller 109 can, for example, lower at least one of the operating frequency of the CPU 112, a brightness of the display panel PN, the brightness of the key board KB, and the brightness of the state indicator 115.

However, the aforementioned description for the hot-swappable electronic device of the first embodiment and the method for preventing crash of the hot-swappable electronic device of the first embodiment are merely examples, and are not meant to limit the scope of the present disclosure.

Second Embodiment

Figure 4:
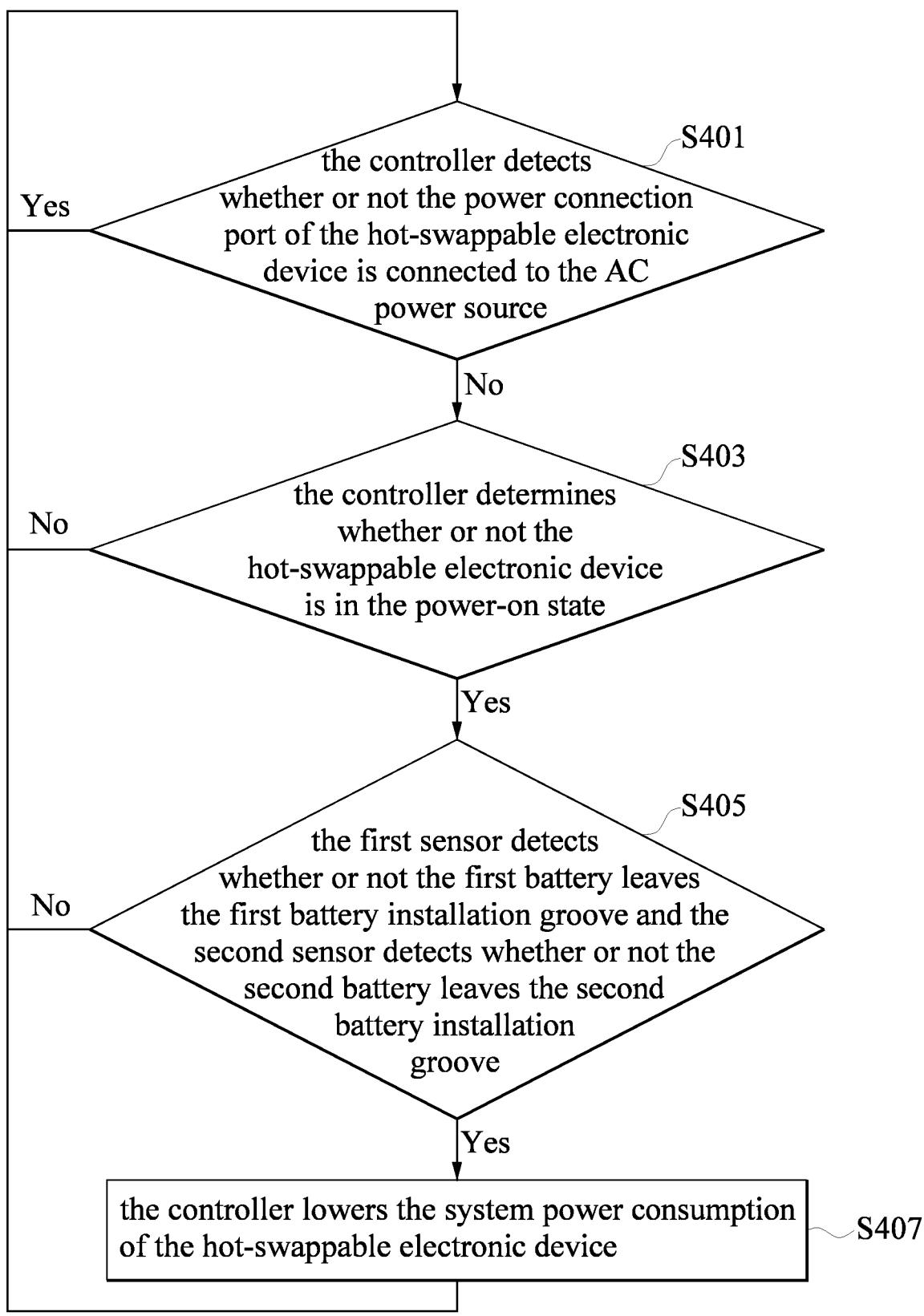
FIG. 4 is a flowchart of a method for preventing crash of the hot-swappable electronic device according to a second embodiment of the present disclosure.

FIG. 4 is a flowchart of a method for preventing crash of the hot-swappable electronic device according to a second embodiment of the present disclosure. Referring to FIG. 4, in step S401, the controller 109 detects whether or not the power connection port 111 of the hot-swappable electronic device is connected to the AC power source. When the controller 109 confirms that the power connection port 111 of the hot-swappable electronic device is not connected to the AC power source, step S401 is followed by the step S403. When the controller 109 confirms that the power connection port 111 of the hot-swappable electronic device is connected to the AC power source, step S403 is followed by step S401.

In step S403, the controller 109 determines whether or not the hot-swappable electronic device is in the power-on state. When the controller 109 confirms that the hot-swappable electronic device is in the power-on state, step S403 is followed by step S405. When the controller 109 confirms that the hot-swappable electronic device is not in the power-on state, step S403 is followed by step S401.

In step S405, the first sensor 105 detects whether or not the first battery 103 leaves the first battery installation groove 101 and the second sensor 106 detects whether or not the second battery 104 leaves the second battery installation groove 102. When the first battery 103 leaves the first battery installation groove 103 or the second battery 104 leaves the second battery installation groove 102, step S405 is followed by step S407. When the first battery 103 does not leave the first battery installation groove 101 and the second battery 104 does not leave the second battery installation groove 102, step S405 is followed by step S401. Specifically, when the first battery 103 leaves the first battery installation groove 101, the first sensor 105 sends the first trigger signal to the controller 109. When the second battery 104 leaves the second battery installation slot groove, the second sensor 106 sends the second trigger signal to the controller 109. Therefore, when the controller 109 receives the first trigger signal or the second trigger signal, it means that one of the first battery 103 and the second battery 104 leaves from the hot-swappable electronic device.

In step S407, the controller 109 lowers the system power consumption of the hot-swappable electronic device, step S407 is followed by step S401. With regard to lowering of the system power consumption, the controller 109 can, for example, lower at least one of the operating frequency of the CPU 112, the brightness of the display panel PN, the brightness of the key board KB, and the brightness of the state indicator 115.

However, the aforementioned description for the method for preventing crash of the hot-swappable electronic device of the second embodiment is merely an example, and is not meant to limit the scope of the present disclosure.

Beneficial Effects of the Embodiments

In conclusion, when a user removes the first battery or the second battery from the hot-swappable electronic device, the hot-swappable electronic device is still able to operate in a stable manner and does not suddenly crash. Accordingly, the user's operation of the hot-swappable electronic device will not be interrupted by the crash.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A hot-swappable electronic device, comprising:
a first battery installation groove;
a first battery installed in the first battery installation groove;
a second battery installation groove;
a second battery installed in the second battery installation groove;
a power connection port;
a controller electrically connected to the power connection port;
a first sensor electrically connected to the controller and assembled in the first battery installation groove, wherein the first sensor sends a first trigger signal to the controller when the first battery leaves the first battery installation groove; and
a second sensor electrically connected to the controller and assembled in the second battery installation groove, wherein the second sensor sends a second trigger signal to the controller when the second battery leaves the second battery installation groove;
wherein the controller is used to determine whether or not the hot-swappable electronic device is in a power-on state and detects whether or not the power connection port is connected to an alternating current power source;
wherein, when the hot-swappable electronic device is in the power-on state, the power connection port is not connected to the alternating current power source, and the controller receives the first trigger signal or the second trigger signal, the controller lowers a system power consumption of the hot-swappable electronic device.

2. The hot-swappable electronic device according to claim 1, wherein the controller is connected to a central processing unit and a backlight source; wherein, when the hot-swappable electronic device is in the power-on state, the power connection port is not connected to the alternating current power source, and the controller receives the first trigger signal or the second trigger signal, the controller lowers at least one of an operating frequency of the central processing unit and a brightness of the backlight source.

3. The hot-swappable electronic device according to claim 1, wherein the controller is an embedded controller, and the first sensor and the second sensor are two Hall sensors.

4. A method for preventing crash of a hot-swappable electronic device, comprising:

determining, by a controller, whether or not the hot-swappable electronic device is in a power-on state;
detecting, by the controller, whether or not a power connection port is connected to an alternating current power source when the hot-swappable electronic device is in the power-on state;
detecting, by a first sensor, whether or not a first battery leaves a first battery installation groove when the power connection port is not connected to the alternating power source;
detecting, by a second sensor, whether or not a second battery leaves a second battery installation groove when the power connection port is not connected to the alternating current power source; and
lowering, by the controller, a system power consumption of the hot-swappable electronic device when the first battery leaves the first battery installation groove or the second battery leaves the second battery installation groove.

5. The method according to claim 4, further comprising: detecting again, by the controller, whether or not the hot-swappable electronic device is in the power-on state when the power connection port is not connected to the alternating current power source; and detecting again, by the controller, whether or not the hot-swappable electronic device is in the power-on state when the first battery does not leave the first battery installation groove and the second battery does not leave the second battery installation groove.

6. The method according to claim 4, further comprising: sending, by the first sensor, a first trigger signal to the controller when the first battery leaves the first battery installation groove; sending, by the second sensor, a second trigger signal to the controller when the second battery leaves the second battery installation groove; and lowering, by the controller, the system power consumption of the hot-swappable electronic device when the controller receives the first trigger signal or the second trigger signal.

7. The method according to claim 4, wherein lowering the system power consumption of the hot-swappable electronic device includes lowering at least one of an operating frequency of a central processing unit and a brightness of a backlight source.

8. A method for preventing crash of a hot-swappable electronic device, comprising:
detecting, by a controller, whether or not a power connection port is connected to an alternating current power source;
determining, by the controller, whether or not the hot-swappable electronic device is in a power-on state when the hot-swappable electronic device is not connected to an alternating current power source;
detecting, by a first sensor, whether or not a first battery leaves a first battery installation groove when the hot-swappable electronic device is in the power-on state;
detecting, by a second sensor, whether or not a second battery leaves a second battery installation groove when the hot-swappable electronic device is in the power-on state; and
lowering, by the controller, a system power consumption of the hot-swappable electronic device when the first battery leaves the first battery installation groove or the second battery leaves the second battery installation groove.

9. The method according to claim 8, further comprising: detecting again, by the controller, whether or not the power connection port is connected to the alternating current power source when the first battery does not leave the first battery installation groove and the second battery does not leave the second battery installation groove; and detecting again, by the controller, whether or not the power connection port is connected to the alternating current power source when the hot-swappable electronic device is not in the power-on state.

10. The method according to claim 8, wherein lowering the system power consumption of the hot-swappable electronic device includes lowering at least one of an operating frequency of a central processing unit and a brightness of a backlight source.

\* \* \* \* \*